(12) United States Patent  
Vineis et al.

(10) Patent No.: US 7,594,967 B2  
(45) Date of Patent: Sep. 29, 2009

(54) REDUCTION OF DISLOCATION PILE-UP FORMATION DURING RELAXED LATTICE-MISMATCHED EPITAXY

(75) Inventors: Christopher J. Vineis, Cambridge, MA (US); Richard Westhoff, Hudson, NH (US); Mayank Bulsara, Cambridge, MA (US)

(73) Assignee: AmberWave Systems Corporation, Salem, NH (US)

( * ) Notice: Subject to any disclaimer, the term of this patent is extended or adjusted under 35 U.S.C. 154(b) by 1076 days.

(21) Appl. No.: 10/268,425

(22) Filed: Oct. 10, 2002

(65) Prior Publication Data

US 2004/0040493 A1     Mar. 4, 2004

Related U.S. Application Data

(60) Provisional application No. 60/407,331, filed on Aug. 30, 2002.

(51) Int. Cl.  
*C30B 25/00* (2006.01)

(52) U.S. Cl. .......................... 117/97; 117/84; 117/88; 117/90; 117/94; 117/101; 117/106; 117/902; 117/913; 117/939

(58) Field of Classification Search .................. 117/84, 117/88, 90, 94, 97, 101, 106, 902, 913, 939  
See application file for complete search history.

(56) References Cited

U.S. PATENT DOCUMENTS

| | | |
|---|---|---|
| 4,010,045 A | 3/1977 | Ruehrwein |
| 4,710,788 A | 12/1987 | Dambkes et al. |
| 4,900,372 A | 2/1990 | Lee et al. |
| 4,987,462 A | 1/1991 | Kim et al. |
| 4,990,979 A | 2/1991 | Otto |
| 4,997,776 A | 3/1991 | Harame et al. |
| 5,013,681 A | 5/1991 | Godbey et al. |
| 5,091,767 A | 2/1992 | Bean et al. |
| 5,097,630 A | 3/1992 | Maeda et al. |
| 5,155,571 A | 10/1992 | Wang et al. |
| 5,159,413 A | 10/1992 | Calviello et al. |
| 5,166,084 A | 11/1992 | Pfiester |
| 5,177,583 A | 1/1993 | Endo et al. |
| 5,202,284 A | 4/1993 | Kamins et al. |
| 5,207,864 A | 5/1993 | Bhat et al. |
| 5,208,182 A | 5/1993 | Narayan et al. |
| 5,210,052 A | 5/1993 | Takasaki |

(Continued)

FOREIGN PATENT DOCUMENTS

DE    41 01 167    7/1992

(Continued)

OTHER PUBLICATIONS

Fitzgerald et al. "Totally relaxed GexSi1-x layers with low threading dislocation densities grown on Si substrates", Appl. Phys. Lett. 59 (7), Aug. 1991, pp. 811-813.*

(Continued)

*Primary Examiner*—Robert M Kunemund  
*Assistant Examiner*—Matthew J Song  
(74) *Attorney, Agent, or Firm*—Goodwin Procter LLP (57) ABSTRACT

A semiconductor structure including a cap layer formed over a semiconductor substrate having a rough edge, which discourages formation of dislocation pile-up defects.

46 Claims, 5 Drawing Sheets

U.S. PATENT DOCUMENTS

| | | | |
|---|---|---|---|
| 5,212,110 A | 5/1993 | Pfiester et al. | |
| 5,221,413 A | 6/1993 | Brasen et al. | |
| 5,241,197 A | 8/1993 | Murakami et al. | |
| 5,250,445 A | 10/1993 | Bean et al. | |
| 5,252,173 A | 10/1993 | Inoue | |
| 5,279,687 A | 1/1994 | Tuppen et al. | |
| 5,285,086 A | 2/1994 | Fitzgerald | |
| 5,291,439 A | 3/1994 | Kauffmann et al. | |
| 5,298,452 A | 3/1994 | Meyerson | |
| 5,308,444 A | 5/1994 | Fitzgerald et al. | |
| 5,310,451 A | 5/1994 | Tejwani et al. | |
| 5,316,958 A | 5/1994 | Meyerson | |
| 5,346,848 A | 9/1994 | Grupen-Shemansky et al. | |
| 5,374,564 A | 12/1994 | Bruel | |
| 5,387,796 A | 2/1995 | Joshi et al. | |
| 5,399,522 A | 3/1995 | Ohori | |
| 5,413,679 A | 5/1995 | Godbey | |
| 5,424,243 A | 6/1995 | Takasaki | |
| 5,425,846 A | 6/1995 | Koze et al. | |
| 5,426,069 A | 6/1995 | Selvakumar et al. | |
| 5,426,316 A | 6/1995 | Mohammad | |
| 5,434,102 A | 7/1995 | Watanabe et al. | |
| 5,442,205 A | 8/1995 | Brasen et al. | |
| 5,461,243 A | 10/1995 | Ek et al. | |
| 5,461,250 A | 10/1995 | Burghartz et al. | |
| 5,462,883 A | 10/1995 | Dennard et al. | |
| 5,476,813 A | 12/1995 | Naruse | |
| 5,479,033 A | 12/1995 | Baca et al. | |
| 5,484,664 A | 1/1996 | Kitahara et al. | |
| 5,523,243 A | 6/1996 | Mohammad | |
| 5,523,592 A | 6/1996 | Nakagawa et al. | |
| 5,534,713 A | 7/1996 | Ismail et al. | |
| 5,536,361 A | 7/1996 | Kondo et al. | |
| 5,540,785 A | 7/1996 | Dennard et al. | |
| 5,596,527 A | 1/1997 | Tomioka et al. | |
| 5,617,351 A | 4/1997 | Bertin et al. | |
| 5,630,905 A | 5/1997 | Lynch et al. | |
| 5,633,516 A | 5/1997 | Mishima et al. | |
| 5,659,187 A | 8/1997 | Legoues et al. | |
| 5,683,934 A | 11/1997 | Candelaria | |
| 5,698,869 A | 12/1997 | Yoshimi et al. | |
| 5,714,777 A | 2/1998 | Ismail et al. | |
| 5,728,623 A | 3/1998 | Mori | |
| 5,739,567 A | 4/1998 | Wong | |
| 5,759,898 A | 6/1998 | Ek et al. | |
| 5,777,347 A | 7/1998 | Bartelink | |
| 5,786,612 A | 7/1998 | Otani et al. | |
| 5,786,614 A | 7/1998 | Chuang et al. | |
| 5,792,679 A | 8/1998 | Nakato | |
| 5,801,085 A | 9/1998 | Kim et al. | |
| 5,808,344 A | 9/1998 | Ismail et al. | |
| 5,810,924 A | 9/1998 | Legoues et al. | |
| 5,828,114 A | 10/1998 | Kim et al. | |
| 5,847,419 A | 12/1998 | Imai et al. | |
| 5,859,864 A | 1/1999 | Jewell | |
| 5,877,070 A | 3/1999 | Goesele et al. | |
| 5,891,769 A | 4/1999 | Liaw et al. | |
| 5,906,708 A | 5/1999 | Robinson et al. | |
| 5,906,951 A | 5/1999 | Chu et al. | |
| 5,912,479 A | 6/1999 | Mori et al. | |
| 5,923,046 A * | 7/1999 | Tezuka et al. | 257/24 |
| 5,943,560 A | 8/1999 | Chang et al. | |
| 5,963,817 A | 10/1999 | Chu et al. | |
| 5,966,622 A | 10/1999 | Levine et al. | |
| 5,981,400 A | 11/1999 | Lo | |
| 5,998,807 A | 12/1999 | Lustig et al. | |
| 6,010,937 A | 1/2000 | Karam et al. | |
| 6,013,134 A | 1/2000 | Chu et al. | |
| 6,030,884 A | 2/2000 | Mori | |
| 6,033,974 A | 3/2000 | Henley et al. | |
| 6,033,995 A | 3/2000 | Muller | |
| 6,039,803 A | 3/2000 | Fitzgerald et al. | |
| 6,058,044 A | 5/2000 | Sugiura et al. | |
| 6,059,895 A | 5/2000 | Chu et al. | |
| 6,074,919 A | 6/2000 | Gardner et al. | |
| 6,096,590 A | 8/2000 | Chan et al. | |
| 6,103,559 A | 8/2000 | Gardner et al. | |
| 6,107,653 A * | 8/2000 | Fitzgerald | 257/191 |
| 6,111,267 A | 8/2000 | Fischer et al. | |
| 6,117,750 A | 9/2000 | Bensahel et al. | |
| 6,124,614 A | 9/2000 | Ryum et al. | |
| 6,130,453 A | 10/2000 | Mei et al. | |
| 6,133,799 A | 10/2000 | Favors et al. | |
| 6,140,687 A | 10/2000 | Shimomura et al. | |
| 6,143,636 A | 11/2000 | Forbes et al. | |
| 6,153,495 A | 11/2000 | Kub et al. | |
| 6,154,475 A | 11/2000 | Soref et al. | |
| 6,160,303 A | 12/2000 | Fattaruso | |
| 6,162,688 A | 12/2000 | Gardner et al. | |
| 6,184,111 B1 | 2/2001 | Henley et al. | |
| 6,191,006 B1 | 2/2001 | Mori | |
| 6,191,007 B1 | 2/2001 | Matsui et al. | |
| 6,191,432 B1 | 2/2001 | Sugiyama et al. | |
| 6,193,585 B1 | 2/2001 | Tanabe et al. | |
| 6,194,722 B1 | 2/2001 | Fiorini et al. | |
| 6,204,529 B1 | 3/2001 | Lung et al. | |
| 6,207,977 B1 | 3/2001 | Augusto | |
| 6,210,988 B1 | 4/2001 | Howe et al. | |
| 6,218,677 B1 | 4/2001 | Broekaert | |
| 6,232,138 B1 | 5/2001 | Fitzgerald et al. | |
| 6,235,567 B1 | 5/2001 | Huang | |
| 6,242,324 B1 | 6/2001 | Kub et al. | |
| 6,249,022 B1 | 6/2001 | Lin et al. | |
| 6,251,755 B1 | 6/2001 | Furukawa et al. | |
| 6,261,929 B1 | 7/2001 | Gehrke et al. | |
| 6,266,278 B1 | 7/2001 | Harari et al. | |
| 6,271,551 B1 | 8/2001 | Schmitz et al. | |
| 6,271,726 B1 | 8/2001 | Fransis et al. | |
| 6,291,321 B1 | 9/2001 | Fitzgerald | |
| 6,313,016 B1 | 11/2001 | Kibbel et al. | |
| 6,316,301 B1 | 11/2001 | Kant | |
| 6,323,108 B1 | 11/2001 | Kub et al. | |
| 6,329,063 B2 | 12/2001 | Lo et al. | |
| 6,335,546 B1 | 1/2002 | Tsuda et al. | |
| 6,339,232 B1 | 1/2002 | Takagi | |
| 6,350,993 B1 | 2/2002 | Chu et al. | |
| 6,368,733 B1 | 4/2002 | Nishinaga | |
| 6,372,356 B1 | 4/2002 | Thornton et al. | |
| 6,399,970 B2 | 6/2002 | Kubo et al. | |
| 6,403,975 B1 | 6/2002 | Brunner et al. | |
| 6,406,589 B1 | 6/2002 | Yanagisawa | |
| 6,407,406 B1 | 6/2002 | Tezuka | |
| 6,417,108 B1 * | 7/2002 | Akino et al. | 438/690 |
| 6,420,937 B1 | 7/2002 | Akatsuka et al. | |
| 6,425,951 B1 | 7/2002 | Chu et al. | |
| 6,429,061 B1 | 8/2002 | Rim | |
| 6,482,749 B1 | 11/2002 | Billington et al. | |
| 6,503,773 B2 | 1/2003 | Fitzgerald | |
| 6,515,335 B1 | 2/2003 | Christiansen et al. | |
| 6,518,644 B2 | 2/2003 | Fitzgerald | |
| 6,521,041 B2 | 2/2003 | Wu et al. | |
| 6,525,338 B2 | 2/2003 | Mizushima et al. | |
| 6,555,839 B2 | 4/2003 | Fitzgerald | |
| 6,573,126 B2 | 6/2003 | Cheng et al. | |
| 6,576,532 B1 | 6/2003 | Jones et al. | |
| 6,583,015 B2 | 6/2003 | Fitzgerald et al. | |
| 6,593,191 B2 | 7/2003 | Fitzgerald | |
| 6,594,293 B1 | 7/2003 | Bulsara et al. | |
| 6,602,613 B1 | 8/2003 | Fitzgerald | |
| 6,603,156 B2 | 8/2003 | Rim | |
| 6,682,965 B1 * | 1/2004 | Noguchi et al. | 438/199 |
| 2001/0003364 A1 * | 6/2001 | Sugawara et al. | 257/192 |
| 2001/0014570 A1 | 8/2001 | Wenski et al. | |
| 2002/0043660 A1 | 4/2002 | Yamazaki et al. | |

| | | |
|---|---|---|
| 2002/0052084 A1 | 5/2002 | Fitzgerald |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123183 A1 | 9/2002 | Fitzgerald |
| 2002/0123197 A1 | 9/2002 | Fitzgerald et al. |
| 2002/0125471 A1 | 9/2002 | Fitzgerald et al. |
| 2002/0125497 A1 | 9/2002 | Fitzgerald |
| 2002/0168864 A1 | 11/2002 | Cheng et al. |
| 2002/0185686 A1 | 12/2002 | Christiansen et al. |
| 2003/0003679 A1 | 1/2003 | Doyle et al. |
| 2003/0013323 A1 | 1/2003 | Hammond et al. |
| 2003/0025131 A1 | 2/2003 | Lee et al. |
| 2003/0034529 A1 | 2/2003 | Fitzgerald et al. |
| 2003/0041798 A1 | 3/2003 | Wenski et al. |
| 2003/0057439 A1 | 3/2003 | Fitzgerald |
| 2003/0077867 A1 | 4/2003 | Fitzergald |
| 2003/0102498 A1 | 6/2003 | Braithwaite et al. |
| 2003/0127646 A1 | 7/2003 | Christiansen et al. |
| 2003/0186073 A1 | 10/2003 | Fitzgerald |

FOREIGN PATENT DOCUMENTS

| | | |
|---|---|---|
| DE | 199 36 905 | 3/2001 |
| EP | 0 514 018 | 11/1992 |
| EP | 0 587 520 | 3/1994 |
| EP | 0 683 522 | 11/1995 |
| EP | 0 711 854 | 11/1995 |
| EP | 0711854 A1 * | 5/1996 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| GB | 2 342 777 | 4/2000 |
| JP | 61-14116 | 6/1986 |
| JP | 61-291489 | 12/1986 |
| JP | 63-73398 | 4/1988 |
| JP | 2-210816 | 8/1990 |
| JP | 3-36717 | 2/1991 |
| JP | 04-073930 | 3/1992 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-94420 | 4/1995 |
| JP | 7-106446 | 4/1995 |
| JP | 7-240372 | 9/1995 |
| JP | 10-270685 | 10/1998 |
| JP | 10270685 A * | 10/1998 |
| JP | 11-233744 | 8/1999 |
| JP | 2000-021783 | 1/2000 |
| JP | 2000-031491 | 1/2000 |
| JP | 2000-513507 | 10/2000 |
| JP | 2001-319935 | 11/2001 |
| JP | 2002-076334 | 3/2002 |
| JP | 2002-164520 | 6/2002 |
| JP | 2002-289533 | 10/2002 |
| JP | 2002-356399 | 12/2002 |
| JP | 2003-520444 | 7/2003 |
| WO | 98/59365 | 12/1998 |
| WO | 99/53539 | 10/1999 |
| WO | 00/48239 | 8/2000 |
| WO | 00/54338 | 9/2000 |
| WO | 01/22482 | 3/2001 |
| WO | WO 01/22482 A1 * | 3/2001 |
| WO | 01/54175 | 7/2001 |
| WO | 01/54202 | 7/2001 |
| WO | WO 01/54175 A1 * | 7/2001 |
| WO | WO 01/54202 A1 * | 7/2001 |
| WO | 01/93338 | 12/2001 |
| WO | 01/99169 | 12/2001 |
| WO | 02/13262 | 2/2002 |
| WO | 02/15244 | 2/2002 |
| WO | 02/27783 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 | 10/2002 |
| WO | 03/015140 | 2/2003 |

OTHER PUBLICATIONS

Feichtinger et al. "Misfit Dislocation Nucleation Study in p/p+ Silicon", Journal of Electrochemical Society, 148 (7) Jun. 2001, pp. G379-G382.*

Cheng et al. "Electron mobility enhancement in strained-Si n-MOSFETs fabricated on SiGe-on-Insulator (SGOI) Substrates", IEEE Electron Device Letters, vol. 22, No. 7, Jul. 2001, pp. 321-323.*

Grillot et al., "Acceptor diffusion and segregation in (AlxGa1-x)0.5In0.5P heterostructures," *Journal of Applied Physics*, vol. 91, No. 8 (Apr. 15, 2002), pp. 4891-4899.

Hsu et al., "Surface morphology of related $Ge_xSi_{1-x}$ films," *Applied Physics Letters*, 61 (11) (Sep. 14, 1992), pp. 1293-1295.

International Search Report for International Application No. PCT/US2003/26782, Oct. 15, 2004.

Armstrong et al., "Design of Si/SiGe Heterojunction Complementary Metal-Oxide-Semiconductor Transistors," *IEDM Technical Digest (1995 International Electron Devices Meeting)*, pp. 761-764.

Armstrong, "Technology for SiGe Heterostructure-Based CMOS Devices," PhD Thesis, Massachusetts Institute of Technology, 1999, pp. 1-154.

Augusto et al., "Proposal for a New Process Flow for the Fabrication of Silicon-Based Complementary MOD-MOSFETs without Ion Implantation," *Thin Solid Films*, vol. 294, No. 1-2 (Feb. 15, 1997), pp. 254-258.

Barradas et al., "RBS analysis of MBE-grown SiGe/(001) Si heterostructures with thin, high Ge content SiGe channels for HMOS transistors," *Modern Physics Letters B*, vol. 15 (2001), abstract.

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999), pp. 205-210.

Bouillon et al., "Search for the optimal channel architecture for 0.18/0.12 µm bulk CMOS experimental study," *IEEE* (1996), pp. 21.2.1-21.2.4.

Bruel et al., "® Smart Cut: A Promising New SOI Material Technology," Proceedings of the 1995 IEEE International SOI Conference (Oct. 1995), pp. 178-179.

Bruel, "Silicon on Insulator Material Technology," *Electronic Letters*, vol. 13, No. 14 (Jul. 6, 1995), pp. 1201-1202.

Bufler et al., "Hole transport in strained Si1-xGex alloys on Si1-yGey substrates," *Journal of Applied Physics*, vol. 84, No. 10 (Nov. 15, 1998), pp. 5597-5602.

Bulsara et al., "Relaxed $In_xGa_{1-x}As$ Graded Buffers Grown with Organomettalic Vapor Phase Epitaxy on GaAs," *Applied Physics Letters*, vol. 72, Issue 13 (Jul. 30, 1998), pp. 1608-1610.

Bulsara, "Materials Issues with the Integration of Lattice-Mismatched $In_xGa_{1-x}As$ on GaAs," PhD Thesis, MIT, Jun. 1998, pp. 1-178.

Burghartz et al., "Microwave Inductors and Capacitors in Standard Multilevel Interconnect Silicon Technology," *IEEE Transactions on Microwave Theory and Techniques*, vol. 44, No. 1 (Jan. 1996), pp. 100-104.

Buttard et al., "Toward Two-Dimensional Self-Organization of Nanostructures Using Wafer Bonding and Nanopatterned Silicon Surfaces," *IEEE—2002 Journal of Quantum Electronics*, vol. 38, Issue 8 (Aug. 2002), pp. 995-1005.

Canaperi et al., "Preparation of a relaxed Si-Ge layer on an insulator in fabricating high-speed semiconductor devices with strained epitaxial films," International Business Machines Corporation, USA (2002), abstract.

Carlin et al., "High Efficiency GaAs-on-Si Solar Cells with High Voc using Graded Gesi Buffers," *IEEE—2000* (2000), pp. 1006-1011.

Carlin et al., "Investigation and Development of High Quality GaAs-on-Si for Space Photovoltaics Using a Graded GeSi," PhD Thesis, Ohio State University, 2001, pp. 1-232.

Chang et al., "Selective Etching of SiGe/Si Heterostructures," *Journal of the Electrochemical Society*, No. 1 (Jan. 1991), pp. 202-204.

Charasse et al., "MBE Growth of GaAs on Si at Thomson," *Institute of Electronic Strucure and Laser*.

Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001), pp. 321-323.

Cheng et al., "Relaxed Silicon-Germanium on Insulator Substrate by Layer Transfer," *Journal of Electronic Materials*, vol. 30, No. 12 (2001), pp. L37-L39.

Crumbaker et al., "The Influence of Dislocation Density on Electron Mobility in InP Films on Si," *Applied Physics Letters*, vol. 59, Issue 9 (Aug. 26, 1991), pp. 1090-1092.

Cullis et al., "Growth ripples upon strained SiGe epitaxial layers on Si and misfit dislocation interactions," *Journal of Vacuum Science and Technology A*, vol. 12, No. 4 (Jul./Aug. 1994), pp. 1924-1931.

Currie et al., "Carrier mobilities and process stability of strained Si n- and p-MOSFETs on SiGe virtual substrates," *Journal of Vacuum Science and Technology B*, vol. 19, No. 6 (Nov./Dec. 2001), pp. 2268-2279.

Currie et al., "Controlling Threading Dislocation Densities in Ge on Si Using Graded SiGe Layers and Chemical-Mechanical Polishing," *Applied Physics Letters*, vol. 72, Issue 14 (Apr. 6, 1998), pp. 1718-1720.

Currie, "SiGe Virtual Substrate Engineering for Integration of III-V Materials, Microelectromechanical Systems and Strained Silicon Mosfets with Silicon," PhD Thesis, MIT, 2001, pp. 1-190.

Dilliway et al., "Characterization of Morphology and Defects in Silicon Germanium Virtual Substrates," *Journal of Materials Science*, vol. 11, Issue 7 (2000), pp. 549-556.

Eaglesham et al., "Dislocation-Free Stranski-Krastanow Growth of Ge on Si(100)," *Physical Review Letters*, vol. 64, No. 16 (Apr. 16, 1990), pp. 1943-1946.

Erdtmann et al., "Gainas/Inp Quantum Well Infrared Photodetectors on Si Substrate for Low-Cost Focal Plan Arrays," PhD Thesis, Northwestern University, 2000, pp. 1-225.

Feichtinger et al., "Misfit Dislocation Nucleation Study in p/p+ Silicon," *Journal of The Electrochemical Society*, 148 (7) (2001), pp. G379-G382.

Feijoo et al., "Epitaxial Si-Ge Etch Stop Layers with Ethylene Diamine Pyrocatechol for Bonded and Etchback Silicon-on-Insulator," *Journal of Electronic Materials*, vol. 23, No. 6 (Jun. 1994), pp. 493-496.

Fischetti et al., "Band structure, deformation potentials, and carrier mobility in strained Si, Ge, and SiGe alloys," *Journal of Applied Physics*, vol. 80, No. 4 (Aug. 15, 1996), pp. 2234-2252.

Fischetti, "Long-range Coulomb interactions in small Si devices. Part II. Effective electronmobility in thin-oxide structures," *Journal of Applied Physics*, vol. 89, No. 2 (Jan. 15, 2001), pp. 1232-1250.

Fitzgerald, "Dislocations in strained-layer epitaxy: theory, experiment, and applications," *Materials Science Reports*, vol. 7 (1991), pp. 87-142.

Fitzgerald et al., "Dislocation dynamics in relaxed graded composition semiconductors," *Materials Science and Engineering*, B67 (1999), pp. 53-61.

Fitzgerald et al., "GeSi/Si Nanostructures," Department of Material Science, MIT (1995), pp. 1-15.

Fitzgerald et al., "Relaxed GexSi1-x structures for III-V integration with Si and high mobility two-dimensional electron gases in Si," *Journal of Vacuum Science Technology*, B 10(4) (Jul./Aug. 1992), pp. 1807-1819.

Fitzgerald et al., "Totally Relaxed GexSi1-x Layers with Low Threading Dislocation Densitites Grown on Si Substrates," *Applied Physics Letters*, vol. 59, No. 7 (Aug. 12, 1991), pp. 811-813.

Garone et al., "Silicon vapor phase epitaxial growth catalysis by the presence of germane," *Applied Physics Letters*, vol. 56, No. 13 (Mar. 26, 1990), pp. 1275-1277.

Giovane et al., "Strain-Balanced Silicon-Germanium Materials for Near IR Photodetection in Silicon-Based Optical Interconnects," PhD Thesis, MIT, 1998, pp. 1-134.

Gray et al., "Analysis and Design of Analog Integrated Circuits," John Wiley & Sons, 1984, pp. 605-632.

Groenert et al., "Strategies for Direct Monolithic Integration of AlxGa(1-x)As/InxGa(1-x)As LEDs and Lasers on Ge/GeSi/Si Substrates Via Relaxed Graded GexSi(1-x) Buffer Layers," *Materials Research Society Symposium Proceedings*, vol. 692 (2002), pp. H.9.30.1-H.9.30.6.

Grützmacher et al., "Ge segregation in SiGe/Si heterostructures and its dependence on deposition technique and growth atmosphere," *Applied Physics Letters*, vol. 63, No. 18 (Nov. 1, 1993), pp. 2531-2533.

Hackbarth et al., "Alternatives to thick MBE-grown relaxed SiGe buffers," *Thin Solid Films*, vol. 369, No. 1-2 (Jul. 2000), pp. 148-151.

Hackbarth et al., "Strain relieved SiGe buffers for Si-based heterostructure field-effect transistors," *Journal of Crystal Growth*, vol. 201/202 (1999), pp. 734-738.

Herzog et al., "SiGe-based FETs: buffer issues and device results," *Thin Solid Films*, vol. 380 (2000), pp. 36-41.

Höck et al., "Carrier mobilities in modulation doped Si1-xGex heterostructures with respect to FET applications," *Thin Solid Films*, vol. 336 (1998), pp. 141-144.

Höck et al., "High hole mobility in Si0.17 Ge0.83 channel metal-oxide-semiconductor field-effect transistors grown by plasma-enhanced chemical vapor deposition," *Applied Physics Letters*, vol. 76, No. 26 (Jun. 26, 2000), pp. 3920-3922.

Höck et al., "High performance 0.25 μm p-type Ge/SiGe MODFETs," *Electronics Letters*, vol. 34, No. 19 (Sep. 17, 1998), pp. 1888-1889.

Houghton, "Strain Relaxation Kinetics in $Si_{1-x}Ge_x$/Si Heterostructures," *Journal of Applied Physics*, vol. 70, No. 4 (Aug. 15, 1991), pp. 2136-2151.

Hsu et al., "Near Field Scanning Optical Microscopy Studies of Electronic and Photonic Materials and Devices," *Materials Science and Engineering Reports: A Review Journal*, vol. 33 (2001), pp. 1-50.

Huang et al., "High-quality strain-relaxed SiGe alloy grown on implanted silicon-on-insulator substrate," *Applied Physics Letters*, vol. 76, No. 19 (May 8, 2000), pp. 2680-2682.

Huang et al., "The Impact of Scaling Down to Deep Submicron on CMOS RF Circuits," *IEEE Journal of Solid-State Circuits*, vol. 33, No. 7 (Jul. 1998), pp. 1023-1036.

Ishikawa et al., "Creation of Si-Ge-based SIMOX structures by low energy oxygen implantation," Proceedings of the 1997 IEEE International SOI Conference (Oct. 1997), pp. 16-17.

Ishikawa et al., "SiGe-on-insulator substrate using SiGe alloy grown Si(001)," *Applied Physics Letters*, vol. 75, No. 7 (Aug. 16, 1999), pp. 983-985.

Ismail et al., "Modulation-doped n-type Si/SiGe with inverted interface," *Applied Physics Letters*, vol. 65, No. 10 (Sep. 5, 1994), pp. 1248-1250.

Ismail, "Si/SiGe High-Speed Field-Effect Transistors," Electron Devices Meeting, Washington, D.C. (Dec. 10, 1995), pp. 20.1.1-20.1.4.

Kearney et al., "The effect of alloy scattering on the mobility of holes in a Si1-xGex quantum well," *Semiconductor Science and Technology*, vol. 13 (1998), pp. 174-180.

Kim et al., "A Fully Integrated 1.9-GHz CMOS Low-Noise Amplifier," *IEEE Microwave and Guided Wave Letters*, vol. 8, No. 8 (Aug. 1998), pp. 293-295.

Kissinger et al., "Stepwise Equilibrated Graded GexSi1-x Buffer with Very Low Threading Dislocation Density on SI(001)," *Applied Physics Letters*, vol. 66, Issue 16, (Apr. 17, 1995), pp. 2083-2085.

Knall et al., "The Use of Graded InGaAs Layers and Patterned Substrates to Remove Threading Dislocations From GaAs on Si," *Journal of Applied Physics*, vol. 76, Issue 5 (Sep. 1, 1994), pp. 2697-2702.

Koester et al., "Extremely High Transconductance Ge/Si0.4Ge0.6 p-MODFET's Grown by UHV-CVD," *IEEE Electron Device Letters*, vol. 21, No. 3 (Mar. 2000), pp. 110-112.

König et al., "Design Rules for n-Type SiGe Hetero FETs," *Solid State Electronics*, vol. 41, No. 10 (1997), pp. 1541-1547.

König et al., "p-Type Ge-Channel MODFET's with High Transconductance Grown on Si Substrates," *IEEE Electron Device Letters*, vol. 14, No. 4 (Apr. 1993), pp. 205-207.

König et al., "SiGe HBTs and HFETs," *Solid-State Electronics*, vol. 38, No. 9 (1995), pp. 1595-1602.

Kummer et al., "Low energy plasma enhanced chemical vapor deposition," *Materials Science and Engineering*, B89 (2002), pp. 288-295.

Kuznetsov et al., "Technology for high-performance n-channel SiGe modulation-doped field-effect transistors," *Journal of Vacuum Science and Technology*, B 13(6) (Nov./Dec. 1995), pp. 2892-2896.

Langdo, "High Quality Ge on Si by Epitaxial Necking," *Applied Physics Letters*, vol. 76, Issue 25 (Jun. 19, 2000), pp. 3700-3702.

Larson, "Integrated Circuit Technology Options for RFIC's Present Status and Future Directions," *IEEE Journal of Solid-State Circuits*, vol. 33, No. 3 (Mar. 1998), pp. 387-399.

Lee et al., "CMOS RF Integrated Circuits at 5 GHz and Beyond," *Proceedings of the IEEE*, vol. 88, No. 10 (Oct. 2000), pp. 1560-1571.

Lee et al., "Strained Ge channel p-type metal-oxide-semiconductor field-effect transistors grown on Si1-xGex/Si virtual substrates," *Applied Physics Letters*, vol. 79, No. 20 (Nov. 12, 2001), pp. 3344-3346.

Lee et al., "Strained Ge channel p-type MOSFETs fabricated on Si1-xGex/Si virtual substrates," *Materials Research Society Symposium Proceedings*, vol. 686 (2002), pp. A1.9.1-A1.9.5.

LeGoues et al., "Relaxation of SiGe Thin Films Grown on Si/SiO2 Substrates," *Journal of Applied Physics*, vol. 75, Issue 11 (Jun. 1, 1974), pp. 2730-2738.

Leitz et al., "Channel Engineering of SiGe-Based Heterostructures for High Mobility MOSFETs," *Materials Research Society Symposium Proceedings*, vol. 686 (2002), pp. A3.10.1-A3.10.6.

Leitz et al., "Dislocation glide and blocking kinetics in compositionally grade SiGe/Si," *Journal of Applied Physics*, vol. 90, No. 6 (Sep. 15, 2001), pp. 2730-2736.

Lietz et al., "Hole mobility enhancements in strained Si/Si1-yGey p-type metal-oxide-semiconductor field-effect transistors grown on relaxed Si1-xGex (x<y) virtual substrates," *Applied Physics Letters*, vol. 79, No. 25 (Dec. 17, 2001) pp. 4246-4248.

Li et al., "Design of high speed Si/SiGe heterojunction complementary metal-oxide-semiconductor field effect transistors with reduced short-channel effects," *Journal of Vacuum Science and Technology A*, vol. 20, No. 3 (May/Jun. 2002), pp. 1030-1033.

Liu et al., "Growth Study of Surfactant-Mediated Relaxed SiGe Graded Layers for 1.55-μM Photodetector Applications," *Thin Solid Films*, vol. 380, Issue 1-2 (2000), pp. 54-56.

Liu et al., "High-Quality Ge Films on Si Substrates Using SB Surfactant-Mediated Graded SiGe Buffers," *Applied Physics Letters*, vol. 79, Issue 21 (Nov. 19, 2001), pp. 3431-3433.

Luan et al., "High Quality Ge Epilayers on Si with Low Threading-Dislocations Densities," *Applied Physics Letters*, vol. 75, Issue 19 (Nov. 8, 1999), pp. 2909-2911.

Lu et al., "High Performance 0.1 μm Gate-Length P-Type SiGe MODFET's and MOS-MODFET's," *IEEE Transactions on Electron Devices*, vol. 47, No. 8 (Aug. 2000), pp. 1645-1652.

Luo et al., "High-Quality Strain-Relaxed SiGe Films Grown with Low Temperature Si Buffer," *Journal of Applied Physics*, vol. 89, Issue 13 (Sep. 23, 1991), pp. 1611-1613.

Maiti et al., "Strained-Si heterostructure field effect transistors," *Semiconductor Science and Technology*, vol. 13 (1998), pp. 1225-1246.

Maszara, "Silicon-On-Insulator by Wafer Bonding: A Review," *Journal of the Electrochemical Society*, No. 1 (Jan. 1991), pp. 341-347.

Meyerson et al., "Cooperative Growth Phenomena in Silicon/Germanium Low-Temperature Epitaxy," *Applied Physics Letters*, vol. 53, No. 25 (Dec. 19, 1988), pp. 2555-2557.

Mizuno et al., "Advanced SOI-MOSFETs with Strained-Si Channel for High Speed CMOS-Electron/Hole Mobility Enhancement," 2002 Symposium on VLSI Technology, Honolulu (Jun. 13-15), *IEEE New York*, pp. 210-211.

Mizuno et al., "Electron and Hole Mobility Enhancement in Strained-Si MOSFET's on SiGe-on-Insulator Substrates Fabricated by SIMOX Technology," *IEEE Electron Device Letters*, vol. 21, No. 5 (May 2000), pp. 230-232.

Mizuno et al., "High Performance Strained-Si p-MOSFETs on SiGe-on-Insulator Substrates Fabricated by SIMOX Technology," *IEEE IDEM Technical Digest* (1999 International Electron Device Meeting), pp. 934-936.

Momose et al., "Dislocation-Free and Lattice-Matched Si/GAP1-xNx/Si Structure for Photo-Electronic Integrated Systems," *Applied Physics Letters*, vol. 79, Issue 25 (Dec. 17, 2001), pp. 4151-4153.

Monroe et al., "Comparison of Mobility-Limiting Mechanisms in High-Mobility Si1-xGex Heterostructures," *Journal of Vacuum Science and Technology B*, vol. B11, Issue 4 (Jul./Aug. 1993), pp. 1731-1737.

Nayak et al., "High-Mobility Strained-Si PMOSFET's," *IEEE Transactions on Electron Devices*, vol. 43, No. 10 (Oct. 1996), pp. 1709-1716.

Oh et al., "Interdigitated Ge P-I-N Photodetectors Fabricated on a Si Substrate Using Graded SiGe Buffer Layers," *IEEE—Journal of Quantum Electronics*, vol. 38, Issue 9 (Sep. 2002), pp. 1238-1241.

Ohori et al., "Effect of Threading Dislocations on Mobility in Selectively Doped Heterostructures Grown on Si Substrates," *Journal of Applied Physics*, vol. 75, Issue 7 (Apr. 1, 1994), pp. 3681-3683.

O'Neill et al., "SiGe virtual substrate N-channel heterojunction MOSFETS," *Semiconductor Science and Technology*, vol. 14 (1999), pp. 784-789.

Ota, "Application of heterojunction FET to power amplifier for cellular telephone," *Electronic Letters*, vol. 30, No. 11 (May 26, 1994), pp. 906-907.

Papananos, "Radio-Frequency Microelectronic Circuits for Telecommunication Applications," Kluwer Academic Publishers, 1999, pp. 115-117, 188-193.

Parker et al., "SiGe heterostructure CMOS circuits and applications," *Solid State Electronics*, vol. 43 (1999), pp. 1497-1506.

Powell et al., "New Approach to the Growth of Low Dislocation Relaxed SiGe Material," *Applied Physics Letters*, vol. 64, Issue 14 (Apr. 4, 1994), pp. 1856-1858.

Ransom et al., "Gate-Self-Aligned n-channel and p-channel Germanium MOSFET's," *IEEE Transactions on Electron Devices*, vol. 38, No. 12 (Dec. 1991), pp. 2695.

Reinking et al., "Fabrication of high-mobility Ge p-channel MOSFETs on Si substrates," *Electronics Letters*, vol. 35, No. 6 (Mar. 18, 1999), pp. 503-504.

Rim, "Application of Silicon-Based Heterostructures to Enhanced Mobility Metal-Oxide-Semiconductor Field-Effect Transistors," PhD Thesis, Stanford University, 1999, pp. 1-184.

Rim et al., "Enhanced Hole Mobilities in Surface-Channel Strained-Si p-MOSFETs," *IEDM* (1995), pp. 517-520.

Rim et al., "Fabrication and Analysis of Deep Submicron Strained-Si N-MOSFET's," *IEEE Transactions on Electron Devices*, vol. 47, No. 7 (Jul. 2000), pp. 1406-1415.

Robbins et al., "A model for heterogeneous growth of Si1-xGex films for hydrides," *Journal of Applied Physics*, vol. 69, No. 6 (Mar. 15, 1991), pp. 3729-3732.

Sadek et al., "Design of Si/SiGe Heterojunction Complementary Metal-Oxide-Semiconductor Transistors," *IEEE Transactions on Electron Devices* (Aug. 1996), pp. 1224-1232.

Sakaguchi et al., "ELTRAN® by Splitting Porous Si Layers," Proceedings of the 195th International SOI Symposium, vol. 99-3 (1999), pp. 117-121.

Sakai et al., "Reduction of Threading Dislocation Density in SiGe Layers on Si (001) Using a Two-Step Strain—Relaxation Procedure," *Applied Physics Letters*, vol. 79, Issue 21 (Nov. 19, 2001), pp. 3398-3400.

Sarnavedam et al., "Novel Dislocation Structure and Surface Morphology Effects in Relaxed Ge/Si-Ge (graded) / Si Structures," *Journal of Applied Physics*, vol. 87, Issue 7 (Apr. 1, 1997), pp. 3108-3116.

Schäffler, "High-Mobility Si and Ge Structures," *Semiconductor Science and Technology*, vol. 12 (1997), pp. 1515-1549.

Schimmel, "Defect Etch for <100> Silicon Evaluation," *Journal of the Electrochemical Society*, vol. 126, No. 3 (Mar. 1979), pp. 479-482.

Sugimoto et al., "A 2V, 500 MHz and 3V, 920 MHz Low-Power Current-Mode 0.6 μm CMOS VCO Circuit," *IEICE Trans Electron*, vol. E82-C, No. 7 (Jul. 1999), pp. 1327-1329.

Taylor et al., "Optoelectronic Device Performance on Reduced Threading Dislocation Density GaAs/Si," *American Institute of Physics*, vol. 89, Issue 8 (Apr. 15, 2001), pp. 4365-4375.

Tement et al., "Metal Gate Strained Silicon MOSFETs for Microwave Integrated Circuits," *IEEE* (Oct. 2000), pp. 38-43.

Ting et al., "Monolithic Integration of III-V Materials and Devices on Silicon," *SPIE Conference 1999-Silicon Based Optoelectronics*, vol. 3630, (Jan. 1999), pp. 19-28.

Tsang et al., "Measurements of alloy composition and strain in thin $Ge_xSi_{1-x}$ layers," *Journal of Applied Physics*, vol. 75, No. 12, (Jun. 15, 1994), pp. 8098-8108.

Tweet et al., "Factors determining the composition of strained GeSi layers grown with disilane and germane," *Applied Physics Letters*, vol. 65, No. 20 (Nov. 14, 1994), pp. 2579-2581.

Usami et al., "Spectroscopic study of Si-based quantum wells with neighboring confinement structure," *Semiconductor Science and Technology*, (1997), abstract.

Valtuena et al., "Influence of the Surface Morphology on the Relaxation of Low-Strained InxGa1-x As Linear Buffer Structures," *Journal of Crystal Growth*, vol. 182 (1997), pp. 281-291.

Watson et al., "Relaxed, Low Threading Defect Density Si0.7Ge0.3 Epitaxial Layers Grown on Si by Rapid Thermal Chemical Vapor Deposition," *Journal of Applied Physics*, vol. 75, Issue 1 (Jan. 1, 1994), pp. 263-269.

Welser et al., "Electron Mobility Enhancement in Strained-Si N-Type Metal-Oxide-Semiconductor Field-Effect Transistors," *IEEE Electron Device Letters*, vol. 15, No. 3 (Mar. 1994), pp. 100-102.

Welser et al., "Evidence of Real-Space Hot-Electron Transfer in High Mobility, Strained-Si Multilayer MOSFETs," *IEEE IDEM Technical Digest* (1993 International Electron Devices Meeting), pp. 545-548.

Welser et al., "NMOS and PMOS Transistors Fabricated in Strained Silicon/Relaxed Silicon-Germanium Structures," *IEEE IDEM Technical Digest* (1992 International Electron Devices Meeting), pp. 1000-1002.

Welser, "The Application of Strained Silicon/Relaxed Silicon Germanium Heterostructures to Metal-Oxide-Semiconductor Field-Effect Transistors," PhD Thesis, Stanford University, 1994, pp. 1-205.

Wolf et al., "Silicon Processing for the VLSI Era, Vol. 1: Process Technology," Lattice Press, Sunset Beach, CA, 1986, pp. 384-386.

Xie et al., "Fabrication of High Mobility Two-Dimensional Electron and Hole Gases in GeSi/Si," *Journal of Applied Physics*, vol. 73, Issue 12 (Jun. 15, 1993), pp. 8364-8370.

Xie et al., "Semiconductor Surface Roughness: Dependence on Sign and Magnitude of Bulk Strain," *The Physical Review Letters*, vol. 73, No. 22 (Nov. 28, 1994), pp. 3006-3009.

Xie et al., "Very High Mobility Two-Dimensional Hole Gas in Si/GexSi1-x/Ge Structures Grown by Molecular Beam Epitaxy," *Applied Physics Letters*, vol. 63, Issue 16 (Oct. 18, 1993), pp. 2263-2264.

Xie, "SiGe Field Effect Transistors," *Materials Science and Engineering*, vol. 25, (1999), pp. 89-121.

Yamagata et al., "Bonding, Splitting and Thinning by Porous Si in ELTRAN®; SOI-Epi Wafer™," *Materials Research Society Symposium Proceedings*, vol. 681E (2001), pp. I8.2.1-I8.2.10.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000), pp. 161-163.

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802, 1998, pp. 25-28.

"How to Make Silicon," Wacker University, http://www.wafernet.com/PreWK/h-ptl-as3_wsc_siltronic_com_pages_training_pages_Silic..., Aug. 28, 2002.

"Optimal Growth Technique and Structure for Strain Relaxation of Si-Ge Layers on Si Substrates," *IBM Technical Disclosure Bulletin*, vol. 32, No. 8A (Jan. 1990), pp. 330-331.

"2 Bit/Cell EEPROM Cell Using Band to Band Tunneling for Data Read-Out," *IBM Technical Disclosure Bulletin*, vol. 35, No. 4B (Sep. 1992), pp. 136-140.

Website of Nihon Micro Coating Co. Ltd.—description of Silicon Wafer Edge Polisher, http://www.mipox.co.jp/en/products/2a_machine/poli.html, printed Sep. 10, 2005.

Winkler et al., "On the Effect of Edge Polishing on the Yield of 4 MBit DRAMs," *Electrochemical Society Proceedings*, vol. 98-1, pp. 1325-1336 (1998).

* cited by examiner

REDUCTION OF DISLOCATION PILE-UP FORMATION DURING RELAXED LATTICE-MISMATCHED EPITAXY

RELATED APPLICATIONS

This application claims the benefit of U.S. Provisional Application 60/407,331 filed on Aug. 30, 2002, the entire disclosure of which is hereby incorporated by reference.

FIELD OF THE INVENTION

This invention relates generally to semiconductor substrates and specifically to substrates comprising relaxed lattice-mismatched semiconductor layers.

BACKGROUND

"Virtual substrates" based on silicon (Si) and germanium (Ge) provide a platform for new generations of very large scale integration (VLSI) devices that exhibit enhanced performance in comparison to devices fabricated on bulk Si substrates. The important component of a SiGe virtual substrate is a layer of SiGe that has been relaxed to its equilibrium lattice constant (i.e., one that is larger than that of Si). This relaxed SiGe layer can be directly applied to a Si substrate (e.g., by wafer bonding or direct epitaxy), or atop a relaxed graded SiGe buffer layer in which the lattice constant of the SiGe material has been increased gradually over the thickness of the layer. The SiGe virtual substrate may also incorporate buried insulating layers, in the manner of a silicon-on-insulator (SOI) wafer. To fabricate high-performance devices on these platforms, thin strained layers of semiconductors, such as Si, Ge, or SiGe, are grown on the relaxed SiGe virtual substrates. The resulting biaxial tensile or compressive strain alters the carrier mobilities in the layers, enabling the fabrication of high-speed and/or low-power-consumption devices.

One technique suitable for fabricating strained Si wafers can include the following steps:
1. Providing a silicon substrate that has been edge polished;
2. Epitaxially depositing a relaxed graded SiGe buffer layer to a final Ge composition on the silicon substrate;
3. Epitaxially depositing a relaxed $Si_{1-x}Ge_x$ cap layer having a constant composition on the graded SiGe buffer layer;
4. Planarizing the $Si_{1-x}Ge_x$ cap layer by, e.g., chemical mechanical polishing (CMP);
5. Epitaxially depositing a relaxed $Si_{1-x}Ge_x$ regrowth layer having a constant composition on the planarized surface of the $Si_{1-x}Ge_x$ cap layer; and
6. Epitaxially depositing a strained silicon layer on the $Si_{1-x}Ge_x$ regrowth layer.

The deposition of the relaxed graded SiGe buffer layer enables engineering of the in-plane lattice constant of the SiGe cap layer (and therefore the amount of strain in the strained silicon layer), while reducing the introduction of dislocations. The lattice constant of SiGe is larger than that of Si, and is a direct function of the amount of Ge in the SiGe alloy. As the SiGe graded buffer layer is epitaxially deposited, it will initially be strained to match the in-plane lattice constant of the underlying silicon substrate. However, above a certain critical thickness, the SiGe graded buffer layer will relax to its inherently larger lattice constant.

The process of relaxation occurs through the formation of misfit dislocations at the interface between two lattice-mismatched layers, e.g., a Si substrate and a SiGe epitaxial layer (epilayer). Because dislocations cannot terminate inside a crystal, misfit dislocations have vertical dislocation segments at each end (termed "threading dislocations"), that may rise through the crystal to reach a top surface of the wafer. Both misfit and threading dislocations have stress fields associated with them. As explained by Eugene Fitzgerald et al., *Journal of Vacuum Science and Technology B*, Vol. 10, No. 4, 1992, incorporated herein by reference, the stress field associated with the network of misfit dislocations affects the localized epitaxial growth rate at the surface of the crystal. This variation in growth rates may result in a surface cross-hatch on lattice-mismatched, relaxed graded SiGe buffer layers grown on Si.

The stress field associated with misfit dislocations may also cause dislocation pile-ups under certain conditions. Dislocation pile-ups are a linear agglomeration of threading dislocations. Because pile-ups represent a high localized density of threading dislocations, they may render devices formed in that region unusable. Inhibiting the formation of dislocation pile-ups is, therefore, desirable.

Dislocation pile-ups are formed as follows. (See, e.g., Srikanth Samavedam et al., *Journal of Applied Physics*, Vol. 81, No. 7, 1997, incorporated herein by reference.) A high density of misfit dislocations in a particular region of a crystal will result in that region having a high localized stress field. This stress field may have two effects. First, this stress field may present a barrier to the motion of other threading dislocations attempting to glide past the misfits. This pinning or trapping of threading dislocations due to the high stress field of other misfit dislocations is known as work hardening. Second, the high stress field may strongly reduce the local epitaxial growth rate in that region, resulting in a deeper trough in the surface morphology in comparison to the rest of the surface cross-hatch. This deep trough in the surface morphology may also pin threading dislocations attempting to glide past the region of high misfit dislocations. This cycle may perpetuate itself and result in a linear region with a high density of trapped threading dislocations, i.e., dislocation pile-up.

Numerous theories attempt to explain the nucleation of misfit dislocations regarding where they are formed in the crystal and by what process. These theories include: formation at pre-existing substrate dislocations; heterogeneous formation at defects; and homogeneous formation, i.e., formation in defect-free, perfect crystal regions. As explained by Eugene Fitzgerald, *Materials Science Reports*, Vol. 7, No. 3, 1991, the activation energy for homogeneous dislocation formation is so high that it is unlikely to occur. The most likely source of misfit dislocations in the crystal is heterogeneous nucleation at defects.

As discussed by Petra Feichtinger et al., *Journal of the Electrochemical Society*, Vol. 148, No. 7, 2001, the substrate edge may provide a significant source of defects that serve as heterogeneous nucleation sites for misfit dislocations. As cut from a boule, the substrate edge may need to be further shaped to enable, for example, the substrate to withstand further mechanical handling. This shaping may be done by an edge grinding operation in which grind wheels that mirror the desired edge contour mechanically remove substrate material along the substrate edge. Various grinding grain sizes may be used, depending on the final edge contour or roughness specifications. The choice of mechanical edge shaping process, as well any additional damage removal steps, strongly influence the extent to which the substrate edge may preferentially serve as a heterogeneous source for misfit dislocation nucleation. The mechanical edge shaping process is also commonly referred to as the "edge contour grinding process" or simply the "grinding process." Examples of additional damage removal steps include, but are not limited to, no additional steps (i.e., edge is left unpolished), a caustic etch step, or a caustic etch step plus a chemical-mechanical edge polish step. The additional damage removal process is also commonly referred to as the "edge polish process" or simply the "polish process."

In Feichtinger et al., the authors investigated misfit nucleation formation for p on p+ epitaxial Si, and were interested in preventing the formation of misfit dislocations. Therefore, they preferred a substrate edge finish process that minimized edge defects, and thus minimized the number of heterogeneous misfit nucleation sources.

SUMMARY

The present invention requires the formation of misfit dislocations to fully relax a heteroepitaxial layer comprising, e.g., SiGe, to its inherent lattice constant. To reduce dislocation pile-up, it is preferable to nucleate misfit dislocations uniformly throughout the crystal, thus avoiding localized regions of high misfit dislocation density.

Misfits nucleate at heterogeneous sites, such as imperfections at the substrate edge. In applications, therefore, with few preferred heterogeneous nucleation sites, those particular sites will be responsible for most of the layer relaxation by nucleating a high number of misfit dislocations. The resulting non-uniformity of misfit dislocations may result in pile-ups because the regions of preferred heterogeneous nucleation will have high local concentrations of misfit dislocations.

One might expect that a high-quality polished substrate edge would yield the best quality epitaxial material, i.e., free of dislocation pile-ups. The edge polishing process, however, may not be perfectly uniform. As a result, some local regions along the substrate edge are relatively rougher. These local imperfections have a significantly lower energy barrier for misfit nucleation and therefore serve as effective heterogeneous nucleation sites for misfit dislocations. In this scenario, conditions favor the formation of dislocation pile-ups near the substrate edge because a very limited number of edge sites will nucleate a high number of misfit dislocations during relaxation of the graded SiGe buffer layer. Regions with locally high misfit dislocation densities result in the formation of dislocation pile-ups as discussed above.

In the case of a substrate with a rough edge, however, the entire substrate edge serves as an effective heterogeneous source for nucleation of misfit dislocations. As a result, misfit dislocations are nucleated uniformly everywhere from the substrate edge as the graded buffer layer relaxes. This uniformity helps prevent localized regions of high misfit densities, which in turn reduces the conditions that cause dislocation pile-ups.

In one aspect, the invention features a method for forming a semiconductor structure. A semiconductor substrate is provided having a rough edge. A cap layer is formed over the substrate, the cap layer being substantially relaxed and having a uniform composition, and a lattice constant different from a lattice constant of the semiconductor substrate.

One or more of the following features may be included. The rough edge may have a roughness greater than 10 angstroms. The roughness may be greater than 100 angstroms. The cap layer may have a density of dislocation pile-ups of less than 20/cm. The cap layer may have a threading dislocation density of less than $10^7/cm^2$. The cap layer may include at least one of a group II, a group III, a group IV, a group V, and a group VI element, such as, for example, silicon and germanium. At least a portion of the cap layer may be formed by growth at a growth temperature greater than 600° C. At least a portion of the cap layer may be annealed at a temperature greater than 600° C. The rough edge may be edge polished after at least a portion of the relaxed cap layer is formed.

A relaxed compositionally graded layer may be formed over the substrate, proximate the relaxed cap layer. The graded layer may have a density of dislocation pile-ups of less than 20/cm. The graded layer may have a threading dislocation density of less than $10^7/cm^2$. The graded layer may include at least one of a group II, a group III, a group IV, a group V, and a group VI element, such as silicon and germanium. The graded layer may have a grade rate greater than 5% germanium per micrometer and may be graded to a composition of, e.g., 20% germanium, or higher. At least a portion of the graded layer may be formed by growth at a growth temperature greater than 600° C. At least a portion of the graded layer may be annealed at a temperature greater than 600° C. The rough edge may be polished after at least a portion of the graded layer is formed.

Providing the semiconductor substrate with the rough edge may include roughening the edge of the semiconductor substrate.

A tensilely strained layer may be formed over the relaxed cap layer. At least a portion of the relaxed cap layer may be planarized prior to the formation of the tensilely strained layer. A relaxed compositionally graded layer may be formed over the substrate, proximate the relaxed cap layer. The rough edge may be edge polished after at least a portion of the graded layer is formed. The rough edge may be polished after at least a portion of the relaxed cap layer is formed.

In another aspect, the invention features a method for forming a semiconductor structure. A semiconductor substrate is provided having a rough edge. A cap layer is formed over the substrate, the cap layer being substantially relaxed and having a uniform composition, and a lattice constant different from a lattice constant of the semiconductor substrate. A p-type metal-oxide-semiconductor (PMOS) transistor is formed by: (i) forming a gate dielectric portion over a portion of the relaxed cap layer, (ii) forming a gate over the gate dielectric portion, the gate including a conducting layer, and (iii) forming a source and a drain proximate the gate dielectric portion, the source and drain including p-type dopants.

In yet another aspect, the invention features a method for forming a semiconductor structure. A semiconductor substrate is provided having a rough edge; a cap layer is formed over the substrate, the cap layer being substantially relaxed and having a uniform composition, and a lattice constant different from a lattice constant of the semiconductor substrate. An n-type metal-oxide-semiconductor (NMOS) transistor is formed by (i) forming a gate dielectric portion over a portion of the relaxed cap layer, (ii) forming a gate over the gate dielectric portion, the gate including a conducting layer, and (iii) forming a source and a drain proximate the gate dielectric portion, the source and drain including n-type dopants.

In another aspect, the invention features a method for forming a semiconductor structure. A semiconductor substrate is provided having a rough edge. A cap layer is formed over the substrate, the cap layer being substantially relaxed and having a uniform composition, and a lattice constant different from a lattice constant of the semiconductor substrate. A p-type metal-oxide-semiconductor (PMOS) transistor is formed by: (i) forming a first gate dielectric portion over a first portion of the relaxed cap layer, (ii) forming a first gate over the first gate dielectric portion, the first gate including a first conducting layer, and (iii) forming a first source and a first drain proximate the first gate dielectric portion, the first source and first drain including p-type dopants. An n-type metal-oxide-semiconductor (NMOS) transistor is formed by (i) forming a second gate dielectric portion over a second portion of the relaxed cap layer, (ii) forming a second gate over the second gate dielectric portion, the second gate including a second conducting layer, and (iii) forming a second source and a second drain proximate the second gate dielectric portion, the second source and second drain including n-type dopants.

In another aspect, the invention features a semiconductor structure. The structure includes a semiconductor substrate, and a cap layer disposed over the substrate, the cap layer being substantially relaxed, having a uniform composition, a lattice constant different from the lattice constant of the semiconductor substrate, and a lower density of dislocation pile-ups proximate an edge of the cap layer than a density of dislocation pile-ups present proximate an edge of a cap layer formed under similar conditions on a substrate having a polished edge.

One or more of the following features may also be included. The density of dislocation pile-ups of the cap layer may be less than the density of dislocation pile-ups present proximate an edge of a cap layer formed under similar conditions on a substrate having an edge with a roughness less than 10 angstroms. The cap layer may have a density of dislocation pile-ups of less than 20/cm. The cap layer may have a threading dislocation density of less than $10^7/cm^2$. The cap layer may include at least one of a group II, a group III, a group IV, a group V, and a group VI element, such as, e.g., silicon and germanium. At least a portion of the cap layer may be formed by growth at a growth temperature greater than 600° C. At least a portion of the cap layer may be annealed at a temperature greater than 600° C.

A compositionally graded layer may be disposed proximate the cap layer, with the graded layer being substantially relaxed. The graded layer may have a density of dislocation pile-ups of less than 20/cm. The graded layer may have a threading dislocation density of less than $10^7/cm^2$. The graded layer may include at least one of a group II, a group III, a group IV, a group V, and a group VI element, such as silicon and germanium. The graded layer may have a grade rate greater than 5% germanium per micrometer. The graded layer may be graded to a concentration of 20% germanium, or higher. At least a portion of the graded layer may be formed by growth at a growth temperature greater than 600° C. At least a portion of the graded layer may be annealed at a temperature greater than 600° C.

A tensilely strained layer may be disposed over the cap layer. The tensilely strained layer may include at least one of a group II, a group III, a group IV, a group V, and a group VI element. At least a portion of the cap layer may be planarized. A relaxed compositionally graded layer may be disposed over the substrate, proximate the cap layer. The substrate may include a polished substrate edge and the graded layer may include a polished layer edge.

In another aspect, the invention features a semiconductor structure including a semiconductor substrate. A cap layer is disposed over the substrate, the cap layer being substantially relaxed, and having a uniform composition, and a lattice constant different from a lattice constant of the semiconductor substrate. A p-type metal-oxide-semiconductor (PMOS) transistor is disposed over the relaxed cap layer. The PMOS transistor includes (i) a gate dielectric portion disposed over a portion of the relaxed cap layer, (ii) a gate disposed over the gate dielectric portion, the gate including a conducting layer, and (iii) a source and a drain disposed proximate the gate dielectric portion, the source and first drain including p-type dopants.

In another aspect, the invention features a semiconductor structure including a semiconductor substrate. A cap layer is disposed over the substrate, the cap layer being substantially relaxed, and having a uniform composition, and a lattice constant different from a lattice constant of the semiconductor substrate. An n-type metal-oxide-semiconductor (NMOS) transistor is disposed over the relaxed cap layer. The NMOS transistor includes (i) a gate dielectric portion disposed over a portion of the relaxed cap layer, (ii) a gate disposed over the gate dielectric portion, the gate including a conducting layer, and (iii) a source and a drain disposed proximate the gate dielectric portion, the source and drain including n-type dopants.

In another aspect, the invention features a semiconductor structure including a semiconductor substrate. A cap layer is disposed over the substrate, the cap layer being substantially relaxed, and having a uniform composition, and a lattice constant different from a lattice constant of the semiconductor substrate. A p-type metal-oxide-semiconductor (PMOS) transistor is disposed over the relaxed cap layer, the PMOS transistor including (i) a first gate dielectric portion disposed over a first portion of the relaxed cap layer, (ii) a first gate disposed over the first gate dielectric portion, the first gate including a first conducting layer, and (iii) a first source and a first drain disposed proximate the first gate dielectric portion, the first source and first drain including p-type dopants. An n-type metal-oxide-semiconductor (NMOS) transistor is disposed over the relaxed cap layer. The NMOS transistor includes (i) a second gate dielectric portion disposed over a second portion of the relaxed cap layer, (ii) a second gate disposed over the second gate dielectric portion, the second gate including a second conducting layer, and (iii) a second source and a second drain disposed proximate the second gate dielectric portion, the second source and second drain including n-type dopants.

Like-referenced features represent common features in corresponding drawings.

DETAILED DESCRIPTION

Figure 1:
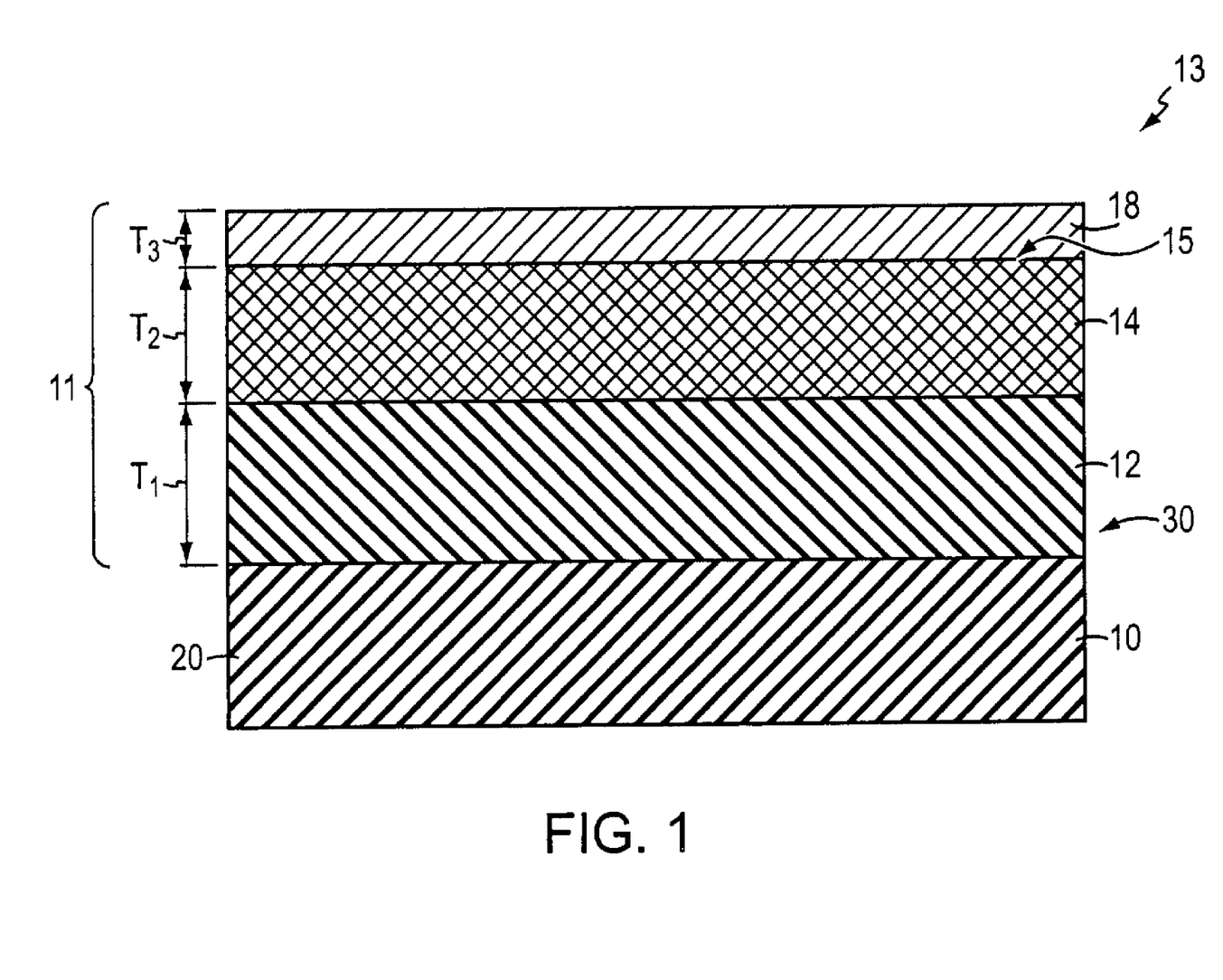
FIGS. 1-4 are schematic cross-sectional views of alternative embodiments of a semiconductor structure fabricated on a substrate.

In an embodiment, creation of misfit dislocations is controlled by postponing the wafer edge-polishing step until after the growth of a relaxed graded buffer layer, preferably before a wafer-surface planarization step. Referring to FIG. 1, a substrate 10 suitable for use with the invention comprises a semiconductor, such as silicon. Several layers collectively indicated at 11 are formed on substrate 10. In contrast to conventional processes, substrate 10 is not edge polished prior to the formation of layers 11. Layers 11 may be grown, for example, in any suitable epitaxial deposition system, including, but not limited to, atmospheric-pressure CVD (APCVD), low- (or reduced-) pressure CVD (LPCVD), ultra-high-vacuum CVD (UHVCVD), or by molecular beam epitaxy (MBE). The epitaxial growth system may be a single-wafer or multiple-wafer batch reactor. The growth system may also utilize a low-energy plasma to enhance the layer growth kinetics. Layers 11 and substrate 10 may be referred to together as "semiconductor wafer 13."

Layers 11 may include a relaxed graded buffer layer 12 disposed over substrate 10. Graded buffer layer 12 may include group IV elements such as SiGe, graded to a final composition of, for example, 10%-100% Ge, i.e., ranging from $Si_{0.9}Ge_{0.1}$ to pure Ge, with a grading rate of, for example, 5% Ge/micrometer (μm) of thickness, or a higher grading rate, with a thickness $T_1$ of, for example, 0.2-20 μm, a threading dislocation density of less than, e.g., $10^7/cm^2$, and grown or annealed, for example, at temperatures higher than 600° C., including, in some embodiments, at temperatures higher than 900° C. In alternative embodiments, graded buffer layer 12 may include group III and group V elements, such as indium (In), gallium (Ga), arsenic (As), and phosphorous (P), and/or group II and group VI elements, such as zinc (Zn), cadmium (Cd), selenium (Se), and tellurium (Te).

A relaxed cap layer 14 may be disposed over graded buffer layer 12. Relaxed cap layer 14 may include, for example, $Si_{1-x}Ge_x$ with a constant composition containing, for example, 10-100% Ge, (i.e., $0.1 \leq x \leq 1.0$) having a thickness $T_2$ of, e.g., 0.1-2 μm. Relaxed cap layer 14 may have a threading dislocation density of less than, e.g., $10^7/cm^2$, and it may be grown or annealed, for example, at temperatures higher than 600° C., including, in some embodiments, at temperatures higher than 900° C. In an alternative embodiment, relaxed cap layer 14 may be formed directly on substrate 10, without graded buffer layer 12. In some embodiments, relaxed cap layer 14 may include group III and group V elements, such as gallium arsenide (GaAs) and/or group II and group VI elements, such as zinc selenide (ZnSe). Relaxed cap layer 14 may have a lattice constant that is different from a lattice constant of substrate 10. For example, relaxed cap layer 14 may be formed from $Si_{0.8}Ge_{0.2}$ having a lattice constant of 5.472 angstroms (Å), over a substrate 10 formed of Si and having a lattice constant of 5.431 Å. In this example, the lattice constant of $Si_{0.8}Ge_{0.2}$ was calculated assuming endpoint lattice constants of 5.431 Å for Si and 5.658 Å for Ge, and using the Dismukes correction for the nonlinear dependence of the SiGe lattice constant on composition. (See, e.g., Dismukes et al., *The Journal of Physical Chemistry* Vol. 68, No. 10, 3021-3027, 1964, incorporated herein by reference.)

A tensilely strained layer 18 may be disposed over relaxed cap layer 14, sharing an interface 15 with relaxed cap layer 14. In an embodiment, tensilely strained layer 18 is formed of silicon. In other embodiments, tensilely strained layer 18 may be formed of SiGe, or at least one of a group II, a group III, a group V, and a group VI element. Tensilely strained layer 18 may have a thickness $T_3$ of, for example, 50-500 Å.

In certain embodiments, relaxed cap layer 14 may be planarized prior to the formation of tensilely strained layer 18. Relaxed cap layer 14 may be planarized by, for example, CMP. In certain embodiments, tensilely strained layer 18 may be formed directly on a planarized surface of relaxed cap layer 14.

Figure 2:
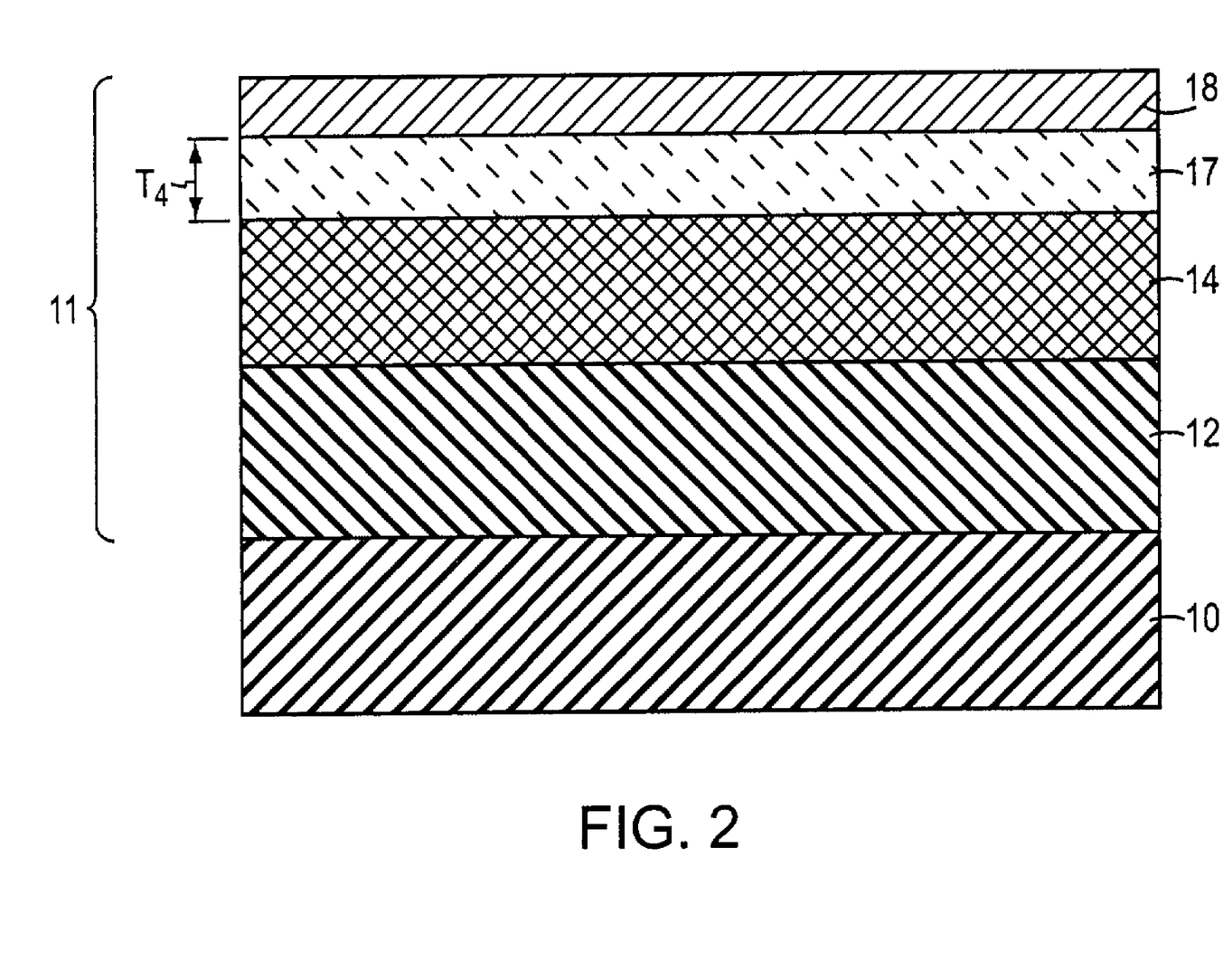

Referring to FIG. 2, in another embodiment, a relaxed regrowth layer 17 having a constant composition may be formed over the planarized surface of cap layer 14, and tensilely strained layer 18 may be subsequently formed over regrowth layer 17. Regrowth layer 17 may include, for example, $Si_{1-x}Ge_x$ with a constant composition containing, for example, 10-100% Ge (i.e., $0.1 \leq x \leq 1.0$) and having a thickness $T_4$ of, e.g., 0.1-2 μm. In some embodiments, relaxed regrowth layer 17 may include group III and group V elements, such as gallium arsenide (GaAs) and/or group II and group VI elements, such as zinc selenide (ZnSe).

Substrate 10 may be provided with a rough outer face or edge 20, having a roughness greater than that of an edge polished substrate. Rough edge 20 has a dull appearance, with a root-mean-square (RMS) roughness greater than, e.g., 10 Å. In some embodiments, the roughness of rough edge 20 is greater than 100 Å, e.g., 200 Å-700 Å, or even greater. The roughness of rough edge 20 may be measured with a commercially available system such as the MP2000+ Surface Analyzer, available from Chapman Instruments, Inc. (Rochester, NY). The roughness of rough edge 20 is inherently present in substrate 10 when, for example, substrate 10 is cut from a boule traditionally formed by the Czochralski method, and is subjected to the conventional mechanical edge shaping process described above. Preserving the roughness of rough edge 20 on substrate 10 may be preferred during the formation of relaxed graded buffer layer 12 and at least a portion of relaxed cap layer 14 because the roughness of rough edge 20 inhibits the formation of dislocation pile-ups. For example, by forming graded buffer layer 12 and relaxed cap layer 14 on substrate 10 having rough edge 20, the dislocation pile-up density in each of graded buffer layer 12 and relaxed cap layer 14 may be less than 20/cm. This low dislocation pile-up density is enabled by the uniform creation of misfit dislocations starting at substrate rough edge 20. By way of comparison, graded buffer layer 12 and/or relaxed cap layer 14 grown on substrate 10 having rough edge 20 will have a lower dislocation pile-up density near the wafer edge than graded buffer layer 12 and/or relaxed cap layer 14 grown on substrate 10 having polished edge 20.

Defect densities may be measured in SiGe by, for example, using a conventional chromic acid-based Schimmel etch. (See, e.g., *Journal of the Electrochemical Society*, Vol. 126: 479 (1979), incorporated herein by reference.). Threading dislocation densities are calculated by examining the etched sample with an optical microscope operated in differential interference contrast, i.e., Nomarski, mode, and counting the number of etch pits per unit area located away from dislocation pile-ups (i.e. not trapped in dislocation pile-ups), yielding units of inverse area ($cm^{-2}$). Dislocation pile-up densities are calculated by measuring the total length of dislocation pile-ups per unit area, yielding units of inverse length ($cm^{-1}$).

In some embodiments, the as-grown boule may have a polished edge, or boule processing steps may result in a substrate with a polished edge. It may then be desirable to roughen the substrate edge prior to forming at least graded buffer layer 12. The edge could be roughened, for example, by using appropriate grit sizes in the mechanical edge shaping process.

Edge 30, including substrate rough edge 20, may be left unpolished, including after the formation of layers 11. In some applications, however, semiconductor wafer 13 having a polished edge 30 may be preferred. Therefore, after the formation of relaxed graded buffer layer 12 on substrate 10 having rough edge 20, edge 30 (including rough edge 20) may be polished to meet other requirements for further processing such as, for example, CMOS processing. Edge 30 may be polished by various techniques, to achieve a smooth surface with a shiny, mirror-like appearance. These techniques may include, but are not limited to, a caustic etch step, or a caustic etch step in combination with chemical-mechanical edge polishing with, e.g., a silica slurry. These polishing steps reduce the roughness of edge 30, and thereby provide the polished edge required for some applications. Because the polishing takes place after the formation of relaxed graded buffer layer 12, however, formation of dislocation pile-ups near wafer edge 30 in graded buffer layer 12 is avoided.

Polishing semiconductor wafer edge 30 after formation of relaxed graded buffer layer 12 but before the formation of tensilely strained layer 18 may provide the additional benefit of creating a higher kinetic barrier to relaxation for tensilely strained layer 18, because polished edge 30 will make the nucleation of misfit dislocations more difficult. This may be desirable because, although graded buffer layer 12 needs to be substantially relaxed, tensilely strained layer 18 may need to remain substantially strained.

Figure 3:
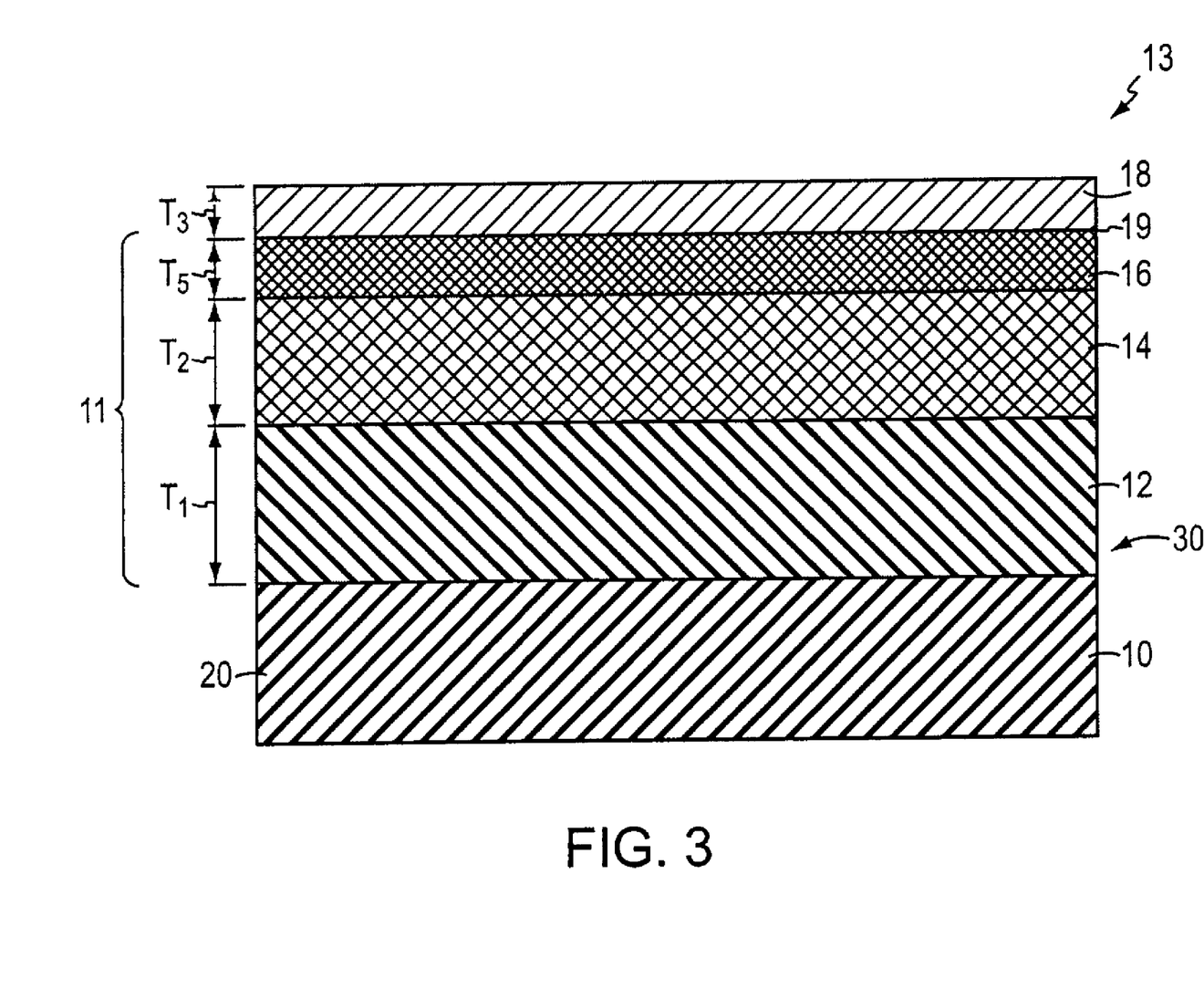

Referring to FIG. 3 as well as to FIG. 1, in some embodiments, a compressively strained layer 16 may be disposed between relaxed cap layer 14 and tensilely strained layer 18, sharing an interface 19 with tensilely strained layer 18. In an embodiment, the compressively strained layer includes $Si_{1-y}Ge_y$ with a Ge content (y) higher than the Ge content (x) of relaxed $Si_{1-x}Ge_x$ cap layer 14. Compressively strained layer 16 may contain, for example, 30-100% Ge (i.e., $0.3 \leq y \leq 1.0$) and have a thickness $T_5$ of, e.g., 50-500 Å. Edge 20 of substrate 10 or edge 30 of substrate 10 and layers 11 may be kept rough during relaxed graded buffer layer 12 formation to reduce dislocation pile-ups, as described above. In an alternative embodiment (not shown), compressively strained layer 16 may be disposed between relaxed regrowth layer 17 and tensilely strained layer 18.

Figure 4:
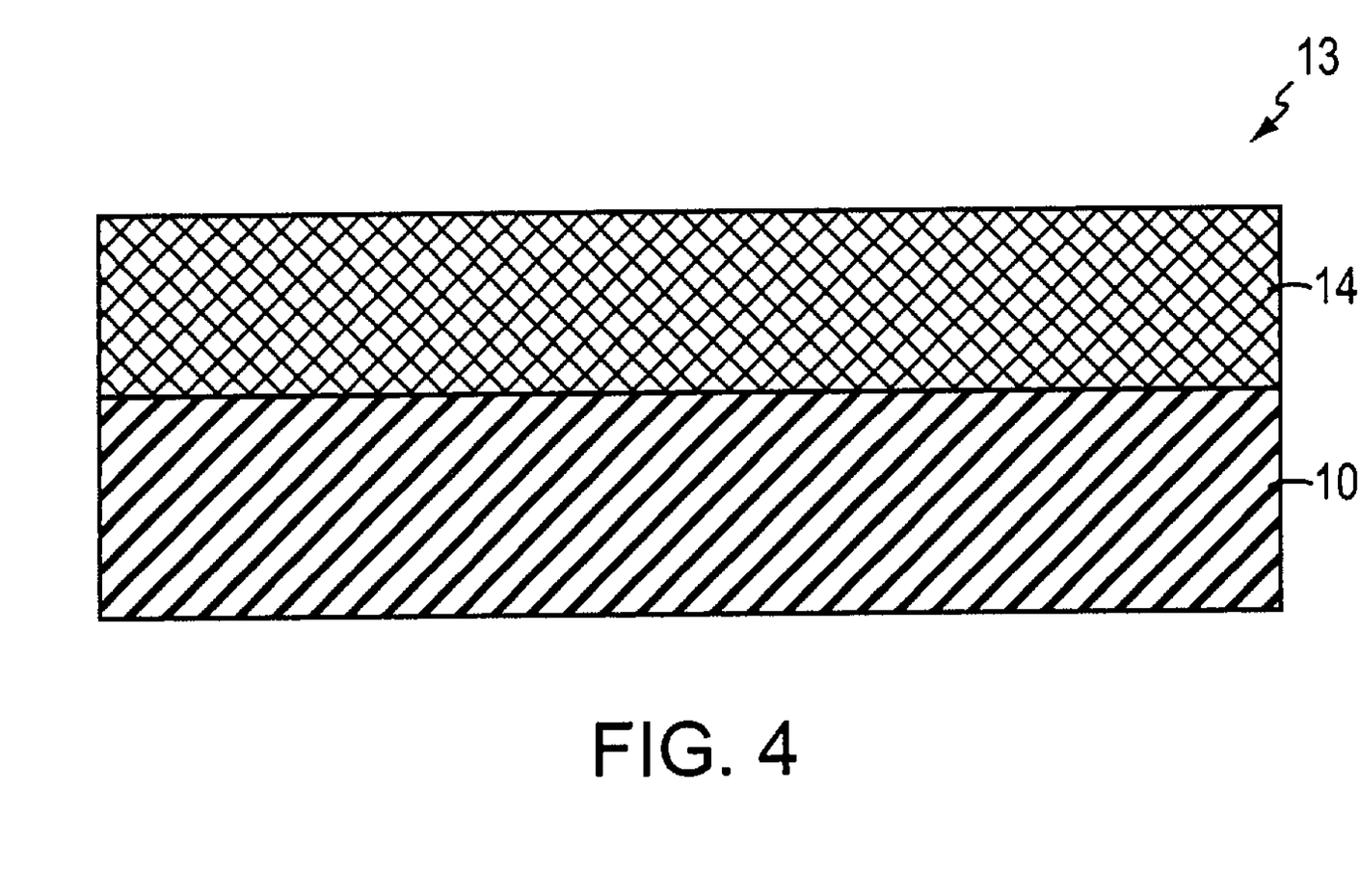

Referring to FIG. 4, in an alternative embodiment, semiconductor wafer 13 may include relaxed layer 14 formed directly on substrate 10, without first forming relaxed graded buffer layer 12 (see, e.g., FIG. 1). Relaxed layer 14 could be formed directly on substrate 10 by, for example, epitaxial deposition, or by wafer bonding and layer transfer.

The present invention has been observed by Nomarski microscopy. Nomarski optical images illustrated a region of the wafer edge of an epitaxial structure including Si substrate 10 with a fully relaxed SiGe graded buffer layer 12 graded to 20% Ge, and a SiGe 20% relaxed cap layer 14 containing 20% Ge. The epitaxial structure was grown on a polished edge 20 Si substrate 10. Graded buffer layers and cap layers were measured to be >99% relaxed by asymmetric (224) glancing-incidence- and glancing-exit-angle x-ray diffraction scans. The high density of dislocation pile-ups caused by the use of a polished-edge 20 substrate 10 was readily observed using Nomarski microscopy as non-uniformities, i.e., breaks, in the otherwise well-behaved cross-hatched surface morphology.

In contrast, in the same structure grown on Si substrate 10 with rough edge 20, the cross-hatch surface morphology was uniform, and no pile-ups were present, in contrast to the structure grown on Si substrate 10 with polished edge 20. The use of substrate 10 with rough edge 20 demonstrably reduced the formation of dislocation pile-ups.

Figure 5:
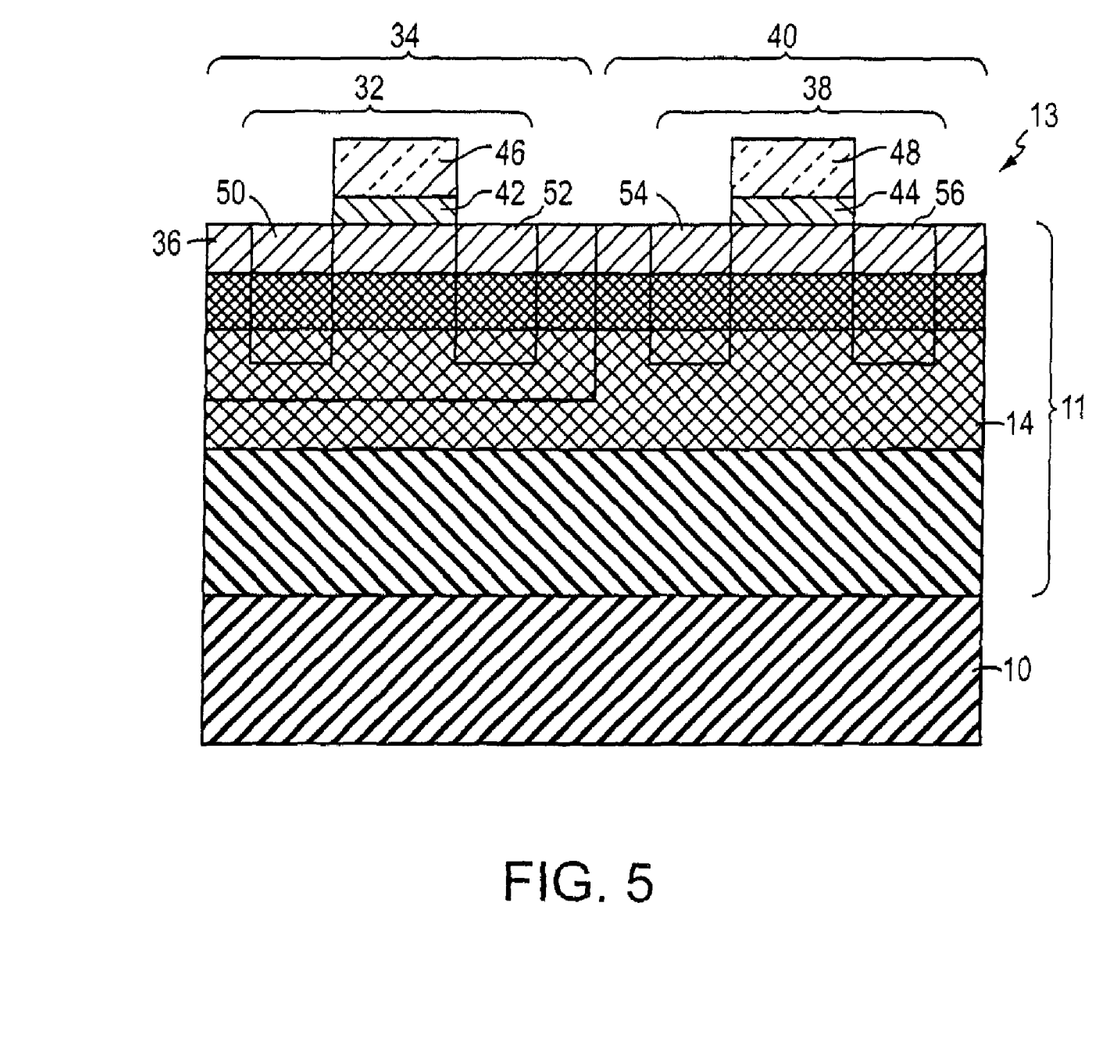
FIG. 5 is a schematic cross-sectional view of a complementary-metal-oxide-semiconductor (CMOS) device fabricated on the substrate illustrated in FIG. 3.

Semiconductor wafers 13 having layers 11 disposed over substrate 10, processed as described above with reference to FIGS. 1, 2, and 3, may be used for the fabrication of various devices, including, for example, CMOS devices and circuits. Referring to FIG. 5, a p-type metal-oxide-semiconductor (PMOS) transistor 32 is formed in a first region 34 of semiconductor wafer 13. An n-type well 36 is formed in layers 11 in first region 34. An n-type metal-oxide-semiconductor (NMOS) transistor 38 is formed in a second region 40 of semiconductor wafer 13. PMOS transistor 32 and NMOS transistor 38 include, respectively, a first gate dielectric portion 42 disposed over a first portion of relaxed cap layer 14 and a second gate dielectric portion 44 disposed over a second portion of relaxed cap layer 14. First and second gate dielectric portions 42, 44 may comprise a gate oxide such as silicon dioxide. A first gate 46 is disposed over first gate dielectric portion 42, and a second gate 48 is disposed over second gate dielectric portion 44. First and second gates 46, 48 may be formed from a conductive material, such as doped polysilicon. A first source 50 and a first drain 52 (defined for purposes of illustration by the interior boundaries) are formed in first region 34, proximate first gate 46. First source 50 and first drain 52 may be formed by the implantation of p-type ions, such as boron. PMOS transistor 32 includes first source 50, first drain 52, first gate 46, and first dielectric portion 42. A second source 54 and a second drain 56 (defined for purposes of illustration by the interior boundaries) are formed in second region 40, proximate second gate 48. Second source 54 and second drain 56 may be formed by the implantation of n-type ions, such as phosphorus. NMOS transistor 38 includes second source 54, second drain 56, second gate 48, and second dielectric portion 44.

In some embodiments, maintaining a rough edge on semiconductor wafer 13, as described above with reference to FIGS. 1-4, may reduce dislocation pile-ups only in regions close to substrate edges 20. It may be preferable, therefore, to control layer growth parameters to also reduce dislocation pile-up defects in a center region of semiconductor wafer 13. Dislocation pile-up densities may be reduced not only by control of the roughness of substrate edge 20 but also by, for example, growing layers at a slower rate, grading relaxed graded buffer layer 12 at a lower rate, and/or growing layers at a higher temperature.

Notwithstanding the foregoing examples, it should be stressed that the invention is applicable to a wide range of epitaxial growth conditions, including but not limited to any combination of precursor source gases or liquids (such as, for example, silane, dichlorosilane, trichlorosilane, silicon tetrachloride, germane, and germanium tetrachloride), any growth pressure, any growth temperature, any layer growth rate, and any graded buffer layer grade rate.

The invention may be embodied in other specific forms without departing from the spirit of essential characteristics thereof. The foregoing embodiments are therefore to be considered in all respects illustrative rather than limiting on the invention described wherein.

What is claimed is:

1. A method for forming a semiconductor structure, comprising the steps of:
    providing a semiconductor substrate having a top surface and a rough edge angled away from the surface;
    thereafter growing a cap layer over the top surface of the substrate, the cap layer being substantially relaxed, having a uniform composition, and having a lattice constant different from a lattice constant of the semiconductor substrate; and
    polishing the rough edge of the substrate after at least a portion of the cap layer is grown.

2. The method of claim 1, wherein the cap layer has a density of dislocation pile-ups of less than 20/cm.

3. The method of claim 1, wherein the cap layer has a threading dislocation density of less than $10^7/cm^2$.

4. The method of claim 1, wherein the cap layer comprises at least one of a group II, a group III, a group IV, a group V, and a group VI element.

5. The method of claim 4, wherein the cap layer comprises silicon and germanium.

6. The method of claim 5, wherein the cap layer comprises approximately 20% germanium.

7. The method of claim 1, wherein at least a portion of the cap layer is formed by growth at a growth temperature greater than 600° C.

8. The method of claim 7, wherein at least a portion of the cap layer is formed at a growth temperature greater than 900° C.

9. The method of claim 1, further comprising:
    annealing at least a portion of the cap layer at a temperature greater than 600° C.

10. The method of claim 9, wherein the portion of the cap layer is annealed at a temperature greater than 900° C.

11. The method of claim 1, wherein providing the semiconductor substrate with the rough edge comprises roughening the edge of the semiconductor substrate.

12. The method of claim 1, further comprising:
forming a strained layer over the relaxed cap layer.

13. The method of claim 12, further comprising:
planarizing at least a portion of the relaxed cap layer prior to the formation of the strained layer.

14. The method of claim 12, further comprising:
forming a relaxed compositionally graded layer over the substrate, proximate the relaxed cap layer.

15. The method of claim 1, further comprising:
forming a p-type metal-oxide-semiconductor (PMOS) transistor by:
  (i) forming a gate dielectric portion over a portion of the relaxed cap layer,
  (ii) forming a gate over the gate dielectric portion, the gate comprising a conducting layer,
  (iii) forming a source and a drain proximate the gate dielectric portion, the source and drain including p-type dopants.

16. The method of claim 1, further comprising:
forming an n-type metal-oxide-semiconductor (NMOS) transistor by:
  (i) forming a gate dielectric portion over a portion of the relaxed cap layer,
  (ii) forming a gate over the gate dielectric portion, the gate comprising a conducting layer,
  (iii) forming a source and a drain proximate the gate dielectric portion, the source and drain including n-type dopants.

17. The method of claim 1-further comprising:
forming a p-type metal-oxide-semiconductor (PMOS) transistor by:
  (i) forming a first gate dielectric portion over a first portion of the relaxed cap layer,
  (ii) forming a first gate over the first gate dielectric portion, the first gate comprising a first conducting layer,
  (iii) forming a first source and a first drain proximate the first gate dielectric portion, the first source and first drain including p-type dopants; and forming an n-type metal-oxide-semiconductor (NMOS) transistor by:
  (i) forming a second gate dielectric portion over a second portion of the relaxed cap layer,
  (ii) forming a second gate over the second gate dielectric portion, the second gate comprising a second conducting layer,
  (iii) forming a second source and a second drain proximate the second gate dielectric portion, the second source and second drain including n-type dopants.

18. The method of claim 1, wherein the rough edge of the substrate defines an edge plane, the top surface defines a surface plane, and the edge plane and the surface plane are non-coplanar.

19. The method of claim 1, wherein the substrate has a bottom surface and the rough edge is disposed between the top and bottom surfaces.

20. A method for forming a semiconductor structure, comprising the steps of:
providing a semiconductor substrate having a top surface and a rough edge angled away from the surface;
thereafter forming a relaxed compositionally graded layer over the top surface of the substrate;
polishing the rough edge of the substrate after at least a portion of the graded layer is formed; and
forming a cap layer over the graded layer, the cap layer being substantially relaxed, having a uniform composition, and having a lattice constant different from a lattice constant of the semiconductor substrate,
wherein the graded layer is proximate the relaxed cap layer.

21. The method of claim 20, wherein the graded layer has a density of dislocation pile-ups of less than 20/cm.

22. The method of claim 20, wherein the graded layer has a threading dislocation density of less than $10^7/cm^2$.

23. The method of claim 20, wherein the graded layer comprises at least one of a group II, a group III, a group IV, a group V, and a group VI element.

24. The method of claim 23, wherein the graded layer comprises silicon and germanium.

25. The method of claim 24, wherein the graded layer has a grade rate greater than 5% germanium per micrometer.

26. The method of claim 20, wherein the graded layer is graded to a concentration of 20% germanium.

27. The method of claim 20, wherein at least a portion of the graded layer is formed by growth at a growth temperature greater than 600° C.

28. The method of claim 27, wherein at least a portion of the graded layer is formed at a growth temperature greater than 900° C.

29. The method of claim 20, further comprising: annealing at least a portion of the graded layer at a temperature greater than 600° C.

30. The method of claim 29, wherein the portion of the graded layer is annealed at a temperature greater than 900° C.

31. The method of claim 20, wherein the rough edge of the substrate defines an edge plane, the top surface defines a surface plane, and the edge plane and the surface plane are non-coplanar.

32. The method of claim 20, wherein the substrate has a bottom surface and the rough edge is disposed between the top and bottom surfaces.

33. A method for forming a semiconductor structure, the method comprising the steps of:
providing a semiconductor substrate having a top surface and a rough edge angled away from the surface;
thereafter forming a relaxed compositionally graded layer over the top surface of the substrate;
forming a cap layer proximate the graded layer, the cap layer being substantially relaxed, having a uniform composition, and having a lattice constant different from a lattice constant of the semiconductor substrate;
forming a strained layer over the relaxed cap layer; and
polishing the rough edge of the substrate after at least a portion of the graded layer is formed.

34. The method of claim 33, wherein the rough edge is polished after at least a portion of the relaxed cap layer is formed.

35. The method of claim 33, wherein the rough edge of the substrate defines an edge plane, the top surface defines a surface plane, and the edge plane and the surface plane are non-coplanar.

36. The method of claim 33, wherein the substrate has a bottom surface and the rough edge is disposed between the top and bottom surfaces.

37. A method for forming a semiconductor structure, comprising the steps of:
providing a semiconductor substrate having a top surface and a rough outer face not coplanar with the top surface;
thereafter growing a cap layer over the top surface of the substrate, the cap layer being substantially relaxed, having a uniform composition, and having a lattice constant different from a lattice constant of the semiconductor substrate; and polishing the rough outer face of the substrate after at least a portion of the cap layer is grown.

38. The method of claim 37, wherein the rough outer face is substantially perpendicular to the top surface.

39. A method for forming a semiconductor structure, comprising the steps of:
    providing a semiconductor substrate having a top surface and a rough outer face not coplanar with the top surface;
    thereafter forming a relaxed compositionally graded layer over the top surface of the substrate;
    polishing the rough outer face of the substrate after at least a portion of the graded layer is formed; and
    forming a cap layer over the graded layer, the cap layer being substantially relaxed, having a uniform composition, and having a lattice constant different from a lattice constant of the semiconductor substrate,
    wherein the graded layer is proximate the relaxed cap layer.

40. The method of claim 39, wherein the rough outer face is substantially perpendicular to the top surface.

41. A method for forming a semiconductor structure, the method comprising the steps of:
    providing a semiconductor substrate having a top surface and a rough outer face not coplanar with the top surface;
    thereafter forming a relaxed compositionally graded layer over the top surface of the substrate;
    forming a cap layer proximate the graded layer, the cap layer being substantially relaxed, having a uniform composition, and having a lattice constant different from a lattice constant of the semiconductor substrate;
    forming a strained layer over the relaxed cap layer; and
    polishing the rough outer face of the substrate after at least a portion of the graded layer is formed.

42. The method of claim 41, wherein the rough outer face is substantially perpendicular to the top surface.

43. A method for forming a semiconductor structure, comprising the steps of:
    providing a semiconductor substrate having a top surface, a bottom surface, and a rough outer face disposed between the top and bottom surfaces;
    thereafter growing a cap layer over the top surface of the substrate, the cap layer being substantially relaxed, having a uniform composition, and having a lattice constant different from a lattice constant of the semiconductor substrate; and
    polishing the rough outer face of the substrate after at least a portion of the cap layer is grown.

44. A method for forming a semiconductor structure, comprising the steps of:
    providing a semiconductor substrate having a top surface, a bottom surface, and a rough outer face disposed between the top and bottom surfaces;
    forming a relaxed compositionally graded layer over the top surface of the substrate having the rough edge; and
    forming a cap layer over the graded layer, the cap layer being substantially relaxed and having a uniform composition, and having a lattice constant different from a lattice constant of the semiconductor substrate,
    wherein the rough outer face has a roughness greater than 10 angstroms.

45. A method for forming a semiconductor structure, comprising the steps of:
    providing a semiconductor substrate having a top surface, a bottom surface, and a rough outer face disposed between the top and bottom surfaces;
    thereafter forming a relaxed compositionally graded layer over the top surface of the substrate;
    polishing the rough outer face of the substrate after at least a portion of the graded layer is formed; and
    forming a cap layer over the graded layer, the cap layer being substantially relaxed, having a uniform composition, and having a lattice constant different from a lattice constant of the semiconductor substrate,
    wherein the graded layer is proximate the relaxed cap layer.

46. A method for forming a semiconductor structure, the method comprising the steps of:
    providing a semiconductor substrate having a top surface defining a surface plane, a bottom surface, and a rough outer face disposed between the top and bottom surfaces;
    thereafter forming a relaxed compositionally graded layer over the top surface of the substrate;
    forming a cap layer proximate the graded layer, the cap layer being substantially relaxed, having a uniform composition, and having a lattice constant different from a lattice constant of the semiconductor substrate;
    forming a strained layer over the relaxed cap layer; and
    polishing the rough outer face of the substrate after at least a portion of the graded layer is formed.

* * * * *